(12) United States Patent
Jeong

(10) Patent No.: US 11,688,464 B2
(45) Date of Patent: Jun. 27, 2023

(54) STORAGE DEVICE AND METHOD OF OPERATING THE SAME

(71) Applicant: SK hynix Inc., Gyeonggi-do (KR)

(72) Inventor: Beom Rae Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 3 days.

(21) Appl. No.: 17/222,036

(22) Filed: Apr. 5, 2021

(65) Prior Publication Data

US 2022/0108751 A1 Apr. 7, 2022

(30) Foreign Application Priority Data

Oct. 7, 2020 (KR) ........................ 10-2020-0129570

(51) Int. Cl.
*G06F 3/06* (2006.01)
*G11C 16/10* (2006.01)
(Continued)

(52) U.S. Cl.
CPC ............ *G11C 16/10* (2013.01); *G06F 3/0629* (2013.01); *G06F 3/0655* (2013.01);
(Continued)

(58) Field of Classification Search
CPC ...... G05B 13/00–048; G05B 15/00–02; G05B 17/00–02; G06F 1/00–3296; G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 17/00–40; G06F 21/00–88; G06F 2009/3883; G06F 2009/45562–45595; G06F 2015/761–768; G06F 2201/00–885;
(Continued)

(56) References Cited

U.S. PATENT DOCUMENTS 9,229,713 B2 * 1/2016 Hansen ............... G06F 9/30145
9,824,760 B2 * 11/2017 Ilani ........................ G06F 7/588
(Continued)

FOREIGN PATENT DOCUMENTS

KR 10-2018-0113230 10/2018
KR 10-2020-0051387 5/2020

OTHER PUBLICATIONS

Joe Brewer; Manzur Gill, "Memory Circuit Technologies," in Nonvolatile Memory Technologies with Emphasis on Flash: A Comprehensive Guide to Understanding and Using Flash Memory Devices , IEEE, 2008, pp. 63-128, doi: 10.1002/9780470181355.ch3. (Year: 2008).*
(Continued)

*Primary Examiner* — Daniel C. Chappell
(74) *Attorney, Agent, or Firm* — IP & T Group LLP

(57) ABSTRACT

Provided herein may be a storage device and a method of operating the same. The storage device may include a memory device including a plurality of memory cells and a memory controller. The memory controller may be configured to control the memory device to generate dummy data based on write data, when a size of the write data is less than a preset size, and to store program data including the write data and the dummy data in selected memory cells among the plurality of memory cells.

16 Claims, 13 Drawing Sheets

(51) Int. Cl.
*G11C 16/04* (2006.01)
*H03K 19/21* (2006.01)

(52) U.S. Cl.
CPC ........ *G06F 3/0679* (2013.01); *G11C 16/0483* (2013.01); *H03K 19/21* (2013.01)

(58) Field of Classification Search
CPC .......... G06F 2206/00–20; G06F 2209/00–549; G06F 2211/00–902; G06F 2212/00–7211; G06F 2213/00–4004; G06F 2216/00–17; G06F 2221/00–2153; G06K 9/00–6298; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 27/00–3293; H01L 2225/00–1094; H03M 7/00–707; H04L 9/00–38; H04L 12/00–66; H04L 41/00–5096; H04L 49/00–9094; H04L 61/00–59; H04L 67/00–75

See application file for complete search history.

(56) References Cited

U.S. PATENT DOCUMENTS

| | | | | |
|---|---|---|---|---|
| 2004/0130945 | A1* | 7/2004 | Sim | G11C 16/10 365/185.2 |
| 2006/0138245 | A1* | 6/2006 | Lee | G11C 11/005 257/E27.103 |
| 2006/0245230 | A1* | 11/2006 | Ambroggi | H01L 25/18 365/63 |
| 2007/0208905 | A1* | 9/2007 | Litsyn | G11C 16/0483 711/103 |
| 2008/0104375 | A1* | 5/2008 | Hansen | G06F 9/30043 712/E9.016 |
| 2008/0189512 | A1* | 8/2008 | Hansen | G06F 9/30014 712/E9.001 |
| 2009/0089540 | A1* | 4/2009 | Hansen | G06F 9/30032 712/E9.002 |
| 2009/0158012 | A1* | 6/2009 | Hansen | G06F 9/30043 712/222 |
| 2010/0165429 | A1* | 7/2010 | Buckley | G03H 1/2205 359/9 |
| 2010/0228930 | A1* | 9/2010 | Haneda | G11C 29/76 711/170 |
| 2012/0020156 | A1* | 1/2012 | Choi | G11C 16/0483 365/185.03 |
| 2017/0032843 | A1* | 2/2017 | Ilani | G06F 12/0246 |
| 2018/0276069 | A1* | 9/2018 | Takayama | G06F 11/1012 |
| 2018/0293007 | A1* | 10/2018 | Jeong | G06F 3/064 |
| 2020/0142637 | A1* | 5/2020 | Park | G06F 3/0679 |

OTHER PUBLICATIONS

D. Takashima, M. Noguchi, N. Shibata, K. Kanda, H. Sukegawa and S. Fujii, "An Embedded DRAM Technology for High-Performance NAND Flash Memories," in IEEE Journal of Solid-State Circuits, vol. 47, No. 2, pp. 536-546, Feb. 2012, doi: 10.1109/JSSC.2011.2170779. (Year: 2012).*

* cited by examiner

US 11,688,464 B2

STORAGE DEVICE AND METHOD OF OPERATING THE SAME

CROSS-REFERENCE TO RELATED APPLICATION

The present application claims priority under 35 U.S.C. § 119(a) to Korean patent application number 10-2020-0129570, filed on Oct. 7, 2020, which is incorporated herein by reference in its entirety.

BACKGROUND

Field of Invention

Various embodiments of the present disclosure generally relate to an electronic device, and more particularly to a storage device and a method of operating the storage device.

Description of Related Art

A storage device is a device which stores data under the control of a host device, such as a computer or a smartphone. The storage device may include a memory device in which data is stored and a memory controller which controls the memory device. Such memory devices are classified into a volatile memory device and a nonvolatile memory device.

The volatile memory device is a memory device in which data is stored only when power is supplied and in which stored data is lost when the supply of power is interrupted. Examples of the volatile memory device include a static random access memory (SRAM) and a dynamic random access memory (DRAM).

The nonvolatile memory device is a memory device in which stored data is retained even when the supply of power is interrupted. Examples of the nonvolatile memory device include a read only memory (ROM), a programmable ROM (PROM), an electrically programmable ROM (EPROM), an electrically erasable and programmable ROM (EEPROM), and a flash memory.

SUMMARY

Various embodiments of the present disclosure are directed to a storage device having improved program performance and a method of operating the storage device.

An embodiment of the present disclosure may provide for a memory device. The memory device may include a plurality of memory cells, a peripheral circuit, and a control logic. The peripheral circuit may be configured to perform a program operation on memory cells selected from among the plurality of memory cells. The control logic may be configured to generate dummy data based on write data when a size of the write data to be programmed to the selected memory cells is less than a preset size, and to control the peripheral circuit to store program data including the write data and the dummy data in the selected memory cells.

An embodiment of the present disclosure may provide for a memory controller for controlling a memory device. The memory controller may include a write buffer and a write controller. The write buffer may be configured to store write data to be programmed to the memory device. The write controller may be configured to control the memory device to generate dummy data based on the write data, when a size of the write data is less than a preset size, and to store program data including the write data and the dummy data.

An embodiment of the present disclosure may provide for a storage device. The storage device may include a memory device including a plurality of memory cells, and a memory controller. The memory controller may be configured to control the memory device to generate dummy data based on write data, when a size of the write data is less than a preset size, and to store program data including the write data and the dummy data in selected memory cells among the plurality of memory cells.

An embodiment of the present disclosure may provide for a memory device. The memory device may include a storage circuitry and a control circuitry. The storage circuitry may be configured to store, therein at a time, program data of a predetermined size. The control circuitry may configured to generate the program data by adding dummy data to provided data.

DETAILED DESCRIPTION

Specific structural or functional descriptions in the embodiments of the present disclosure introduced in this specification or application are examples to describe embodiments according to the concept of the present disclosure. The embodiments according to the concept of the present disclosure may be practiced in various forms, and should not be construed as being limited to the embodiments described in the specification or application.

Figure 1:
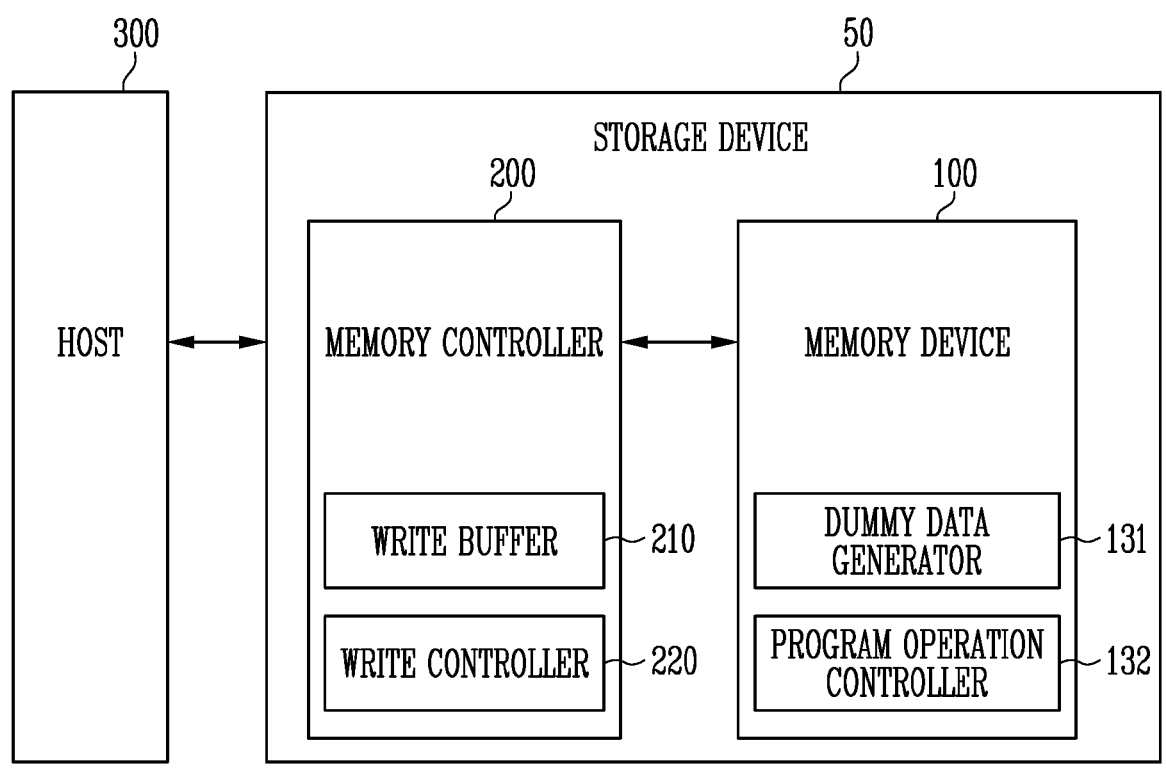
FIG. 1 is a diagram illustrating a storage device according to an embodiment of the present disclosure.

FIG. 1 is a diagram illustrating a storage device according to an embodiment of the present disclosure.

Referring to FIG. 1, a storage device 50 may include a memory device 100 and a memory controller 200 which controls the operation of the memory device. The storage device 50 may be a device which stores data under the control of a host 300, such as a mobile phone, a smartphone, an MP3 player, a laptop computer, a desktop computer, a game console, a television (TV), a tablet PC, or an in-vehicle infotainment system.

The storage device 50 may be manufactured as any of various types of storage devices depending on a host interface that is a scheme for communication with the host 300. The storage device 50 may be implemented as any of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any of various types of package forms. For example, the storage device 50 may be manufactured in any of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 is operated in response to the control of the memory controller 200. The memory device 100 may include a memory cell array including a plurality of memory cells which store data.

Each of the memory cells may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read.

A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change random access memory (PRAM), a magnetoresistive RAM (MRAM), a ferroelectric RAM (FRAM), or a spin transfer torque RAM (STT-RAM). In the present specification, for convenience of description, a description will be made that the memory device 100 is a NAND flash memory.

The memory device 100 may receive a command and an address from the memory controller 200, and may access the area of the memory cell array, selected by the address. That is, the memory device 100 may perform an operation indicated by the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

In an embodiment, the memory device 100 may include a dummy data generator 131 and a program operation controller 132. In other embodiment, the dummy data generator 131 may be an external device of the memory device 100. Thus, the dummy data generator 131 may be located outside the memory device 100.

The dummy data generator 131 may generate dummy data based on write data stored in a main buffer of the memory device 100. The dummy data generator 131 may generate the dummy data based on all or part of the write data.

The program operation controller 132 may store the write data, received from the memory controller 200, in the main buffer. The program operation controller 132 may program the write data, stored in the main buffer, to the memory cell array.

In an embodiment, the program operation controller 132 may control the dummy data generator 131 so that, when the size of the write data, stored in the main buffer, is less than a preset size, dummy data is generated based on the write data. The program operation controller 132 may store the generated dummy data in the main buffer.

The program operation controller 132 may program the program data having the preset size to the memory cell array. The program data may include the write data and the dummy data which are stored in the main buffer. The preset size may be the size of data stored in one physical page. That is, the preset size may be a one-shot program unit on which data is stored in an entire page through one program operation.

The memory controller 200 controls the overall operation of the storage device 50.

When power is applied to the storage device 50, the memory controller 200 may run firmware (FW). When the memory device 100 is a flash memory device, the memory controller 200 may run firmware such as a Flash Translation Layer (FTL) for controlling communication between the host 300 and the memory device 100.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored.

The memory controller 200 may control the memory device 100 so that a program operation, a read operation or an erase operation is performed in response to a request received from the host 300. During a program operation, the memory controller 200 may provide a write command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a command, an address, and data regardless of whether a request from the host 300 is received, and may transmit them to the memory device 100. For example, the memory controller 200 may provide commands, addresses, and data to the memory device 100 to perform background operations, such as a program operation for wear leveling and a program operation for garbage collection.

In an embodiment, the memory controller 200 may control at least two memory devices 100. In this case, the memory controller 200 may control the memory devices 100 using an interleaving scheme to improve operating performance. The interleaving scheme may be an operating manner in which the operating periods of at least two memory devices 100 are caused to overlap each other.

In an embodiment, the memory controller 200 may control the memory device 100 so that, when the size of write data to be programmed to the memory device 100 is less than a preset size, the memory device 100 generates dummy data based on the write data. The memory controller 200 may control the memory device 100 so that program data having the preset size is stored. The program data may include write data provided by the memory controller 200 to the memory device 100 and dummy data generated by the memory device 100.

In an embodiment, the memory controller 200 may include a write buffer 210 and a write controller 220.

The write buffer 210 may store the write data to be provided to the memory device 100.

When the size of the write data stored in the write buffer 210 is less than the preset size, the write controller 220 may provide the memory device 100 with a program command set that includes a dummy generation command indicating the generation of dummy data based on the write data. In an embodiment, the program command set may include a program initiation command indicating the initiation of a program operation, the dummy generation command, and a program confirm command indicating the completion of input for a program operation. The input for the program operation may include the input of data, an address, a command, etc.

As will be described later with reference to FIG. 12, the write controller 220 may provide the memory device 100 with the write data, a write address indicating the area of the memory device 100 in which the write data is to be stored, and the program command set. The program data may be stored in a page selected from among a plurality of pages included in the memory device 100. The write address may include a start address of an area in which the write data is to be stored in the selected page, and a start address of an area in which dummy data is to be stored.

The host 300 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
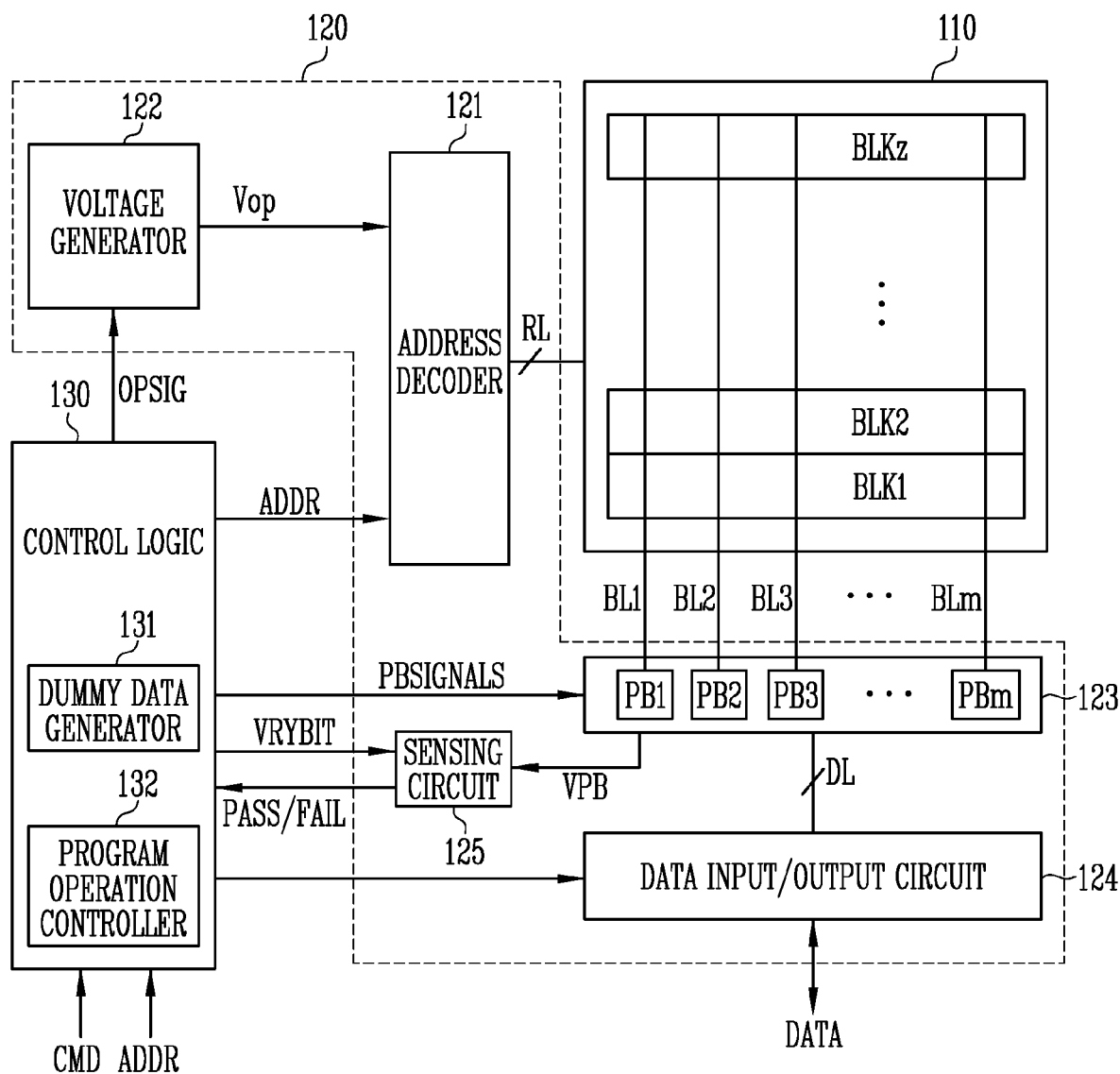
FIG. 2 is a diagram illustrating the structure of a memory device of FIG. 1.

FIG. 2 is a diagram illustrating the structure of the memory device of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single physical page. That is, the memory cell array 110 is composed of a plurality of physical pages. In accordance with an embodiment of the present disclosure, each of the plurality of memory blocks BLK1 to BLKz included in the memory cell array 110 may include a plurality of dummy cells. As the dummy cells, one or more dummy cells may be coupled in series between a drain select transistor and the memory cells and between a source select transistor and the memory cells.

Each of the memory cells of the memory device 100 may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include the address decoder 121, a voltage generator 122, the read and write circuit 123, a data input/output circuit 124, and a sensing circuit 125.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may be operated under the control of the control logic 130. The address decoder 121 receives addresses ADDR from the control logic 130.

The address decoder 121 may decode a block address, among the received addresses ADDR. The address decoder 121 selects at least one of the memory blocks BLK1 to BLKz according to the decoded block address. The address decoder 121 may decode a row address among the received addresses ADDR. The address decoder 121 may select at least one of word lines of the selected memory block according to the decoded row address. The address decoder 121 may apply operating voltages Vop supplied from the voltage generator 122 to the selected word line.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verify pass voltage having a level higher than that of the verify voltage to unselected word lines.

During a read operation, the address decoder 121 may apply a read voltage to a selected word line and apply a read pass voltage having a level higher than that of the read voltage to unselected word lines.

In accordance with an embodiment of the present disclosure, the erase operation of the memory device 100 may be performed on a memory block basis. During an erase operation, the addresses ADDR input to the memory device 100 include a block address. The address decoder 121 may decode the block address and select a single memory block in response to the decoded block address. During the erase operation, the address decoder 121 may apply a ground voltage to word lines coupled to the selected memory block.

In accordance with an embodiment of the present disclosure, the address decoder 121 may decode a column address among the received addresses ADDR. The decoded column address may be transferred to the read and write circuit 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate the plurality of operating voltages Vop using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data DATA to be stored through the data input/output circuit 124 and data lines DL.

During a program operation, the first to m-th page buffers PB1 to PBm may transfer the data DATA to be stored, received through the data input/output circuit 124, to selected memory cells through the bit lines BL1 to BLm when a program pulse is applied to a selected word line. Memory cells in a selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibit voltage (e.g., a supply voltage) is applied may be maintained. During a program verify operation, the first to m-th page buffers PB1 to PBm read the data DATA stored in the selected memory cells from the selected memory cells through the bit lines BL1 to BLm.

During a read operation, the read and write circuit 123 may read data DATA from the memory cells in the selected page through the bit lines BL, and may store the read data DATA in the first to m-th page buffers PB1 to PBm.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated in response to the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 outputs the data DATA, received from the first to m-th page buffers PB1 to PBm included in the read and write circuit 123, to the external controller.

During a read operation or a verify operation, the sensing circuit 125 may generate a reference current in response to an enable bit signal VRYBIT generated by the control logic 130, and may output a pass signal or a fail signal to the control logic 130 by comparing a sensing voltage VPB received from the read and write circuit 123 with a reference voltage generated by the reference current.

The control logic 130 may be coupled to the address decoder 121, the voltage generator 122, the read and write circuit 123, the data input/output circuit 124, and the sensing circuit 125. The control logic 130 may control the overall operation of the memory device 100. The control logic 130 may be operated in response to a command CMD transmitted from an external device.

The control logic 130 may control the peripheral circuit 120 by generating various types of signals in response to the command CMD and the addresses ADDR. For example, the control logic 130 may generate an operation signal OPSIG, an address ADDR, read and write circuit control signals PBSIGNALS, and an enable bit VRYBIT in response to the command CMD and the addresses ADDR. The control logic 130 may output the operation signal OPSIG to the voltage generator 122, output the address ADDR to the address decoder 121, output the read and write circuit control signals PBSIGNALS to the read and write circuit 123, and output the enable bit VRYBIT to the sensing circuit 125. In addition, the control logic 130 may determine whether a verify operation has passed or failed in response to the pass or fail signal PASS or FAIL output from the sensing circuit 125.

In an embodiment, the read and write circuit 123 may include a main buffer including a plurality of page buffers. The main buffer may store data to be programmed to memory cells selected from among the plurality of memory cells included in the memory cell array 110.

In an embodiment, the control logic 130 may include a dummy data generator 131 and a program operation controller 132.

The dummy data generator 131 may generate dummy data based on all or part of write data stored in the main buffer. The dummy data generator 131 may generate dummy data by performing an Exclusive OR (XOR) operation on a preset value and the write data. In an embodiment, the preset value may be a data pattern including at least one bit.

The dummy data generator 131 may generate dummy data based on shift data obtained by shifting the write data depending on the position of a word line to which the write data is to be programmed. For example, the dummy data generator 131 may shift the write data depending on the position of the selected word line coupled to the selected memory cells. The dummy data generator 131 may generate dummy data by performing an exclusive OR (XOR) operation on the preset value and the shift data obtained by shifting the write data.

The program operation controller 132 may store the write data, received from a memory controller described above with reference to FIG. 1, in the main buffer. The program operation controller 132 may control the peripheral circuit 120 so that the write data stored in the main buffer is programmed to the selected memory cells.

In an embodiment, the program operation controller 132 may control the dummy data generator 131 so that, when the size of the write data, stored in the main buffer, is less than a preset size, dummy data is generated based on the write data. The program operation controller 132 may store the generated dummy data in the main buffer.

The program operation controller 132 may control the peripheral circuit 120 so that program data having the preset size is programmed to the selected memory cells. The program data may include the write data and the dummy data which are stored in the main buffer. The preset size may be the size of data stored in one physical page. That is, the preset size may be a one-shot program unit on which data is stored in an entire page through one program operation.

Figure 3:
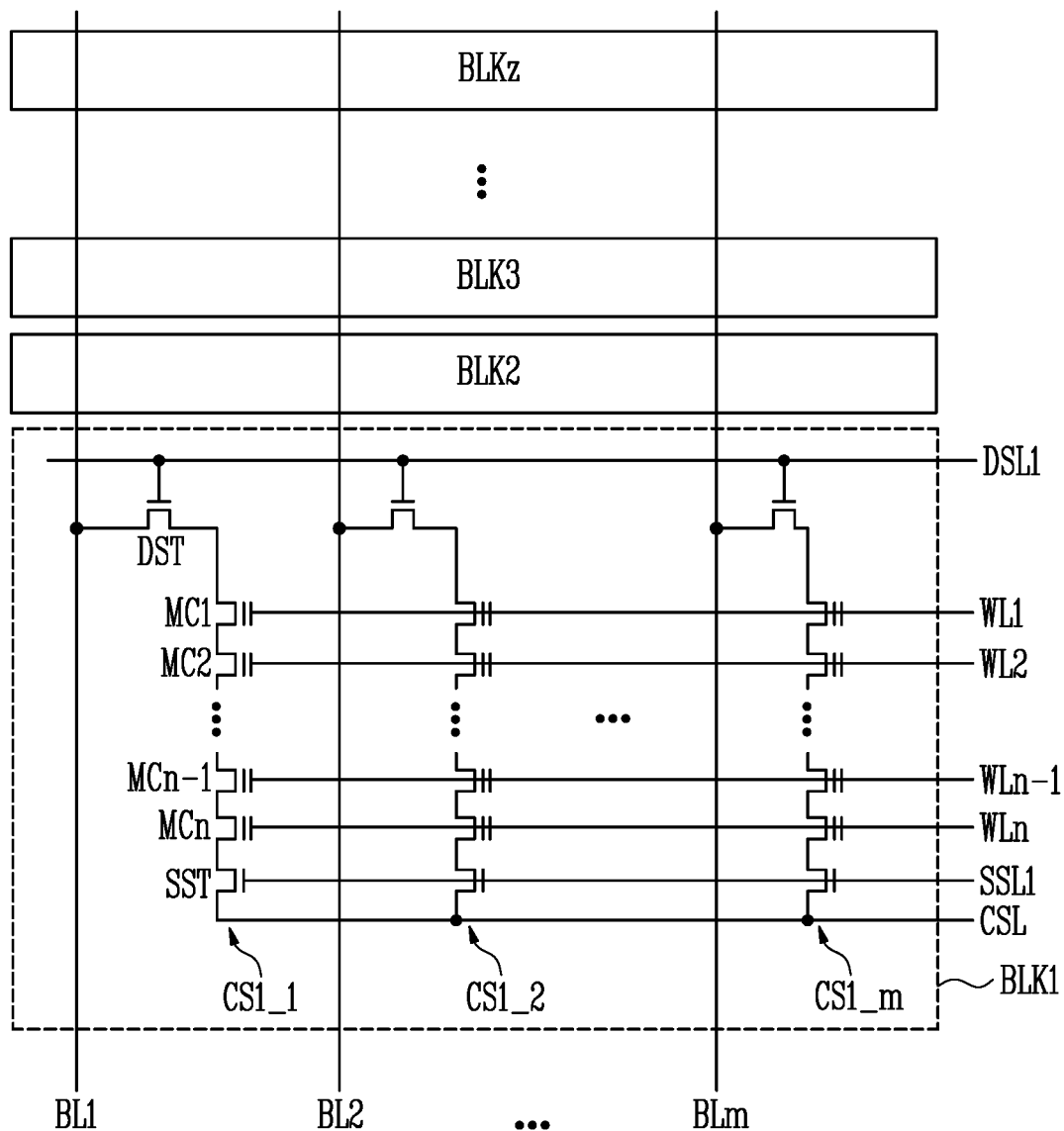
FIG. 3 is a diagram illustrating a memory cell array of FIG. 2.

FIG. 3 is a diagram illustrating the memory cell array of FIG. 2.

Referring to FIG. 3, the first to z-th memory blocks BLK1 to BLKz are coupled in common to the first to m-th bit lines BL1 to BLm. In FIG. 3, for convenience of description, elements included in the first memory block BLK1, among the plurality of memory blocks BLK1 to BLKz, are illustrated, and illustration of elements included in each of the remaining memory blocks BLK2 to BLKz is omitted. It will be understood that each of the remaining memory blocks BLK2 to BLKz has the same configuration as the first memory block BLK1.

The memory block BLK1 may include a plurality of cell strings CS1_1 to CS1_m (where m is a positive integer). The first to m-th cell strings CS1_1 to CS1_m are respectively coupled to the first to m-th bit lines BL1 to BLm. Each of the first to m-th cell strings CS1_1 to CS1_m may include a drain select transistor DST, a plurality of memory cells MC1 to MCn (where n is a positive integer) which are coupled in series to each other, and a source select transistor SST.

A gate terminal of the drain select transistor DST included in each of the first to m-th cell strings CS1_1 to CS1_m is coupled to a drain select line DSL1. Gate terminals of the first to n-th memory cells MC1 to MCn included in each of the first to m-th cell strings CS1_1 to CS1_m are coupled to first to n-th word lines WL1 to WLn, respectively. A gate terminal of the source select transistor SST included in each of the first to m-th cell strings CS1_1 to CS1_m is coupled to a source select line SSL1.

For convenience of description, the structure of each cell string will be described based on the first cell string CS1_1, among the plurality of cell strings CS1_1 to CS1_m. However, it will be understood that each of the remaining cell strings CS1_2 to CS1_m is configured in the same manner as the first cell string CS1_1.

A drain terminal of the drain select transistor DST included in the first cell string CS1_1 is coupled to the first bit line BL1. A source terminal of the drain select transistor DST included in the first cell string CS1_1 is coupled to a drain terminal of the first memory cell MC1 included in the first cell string CS1_1. The first to n-th memory cells MC1 to MCn may be coupled in series to each other. A drain terminal of the source select transistor SST included in the first cell string CS1_1 is coupled to a source terminal of the n-th memory cell MCn included in the first cell string CS1_1. A source terminal of the source select transistor SST included in the first cell string CS1_1 is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 4:
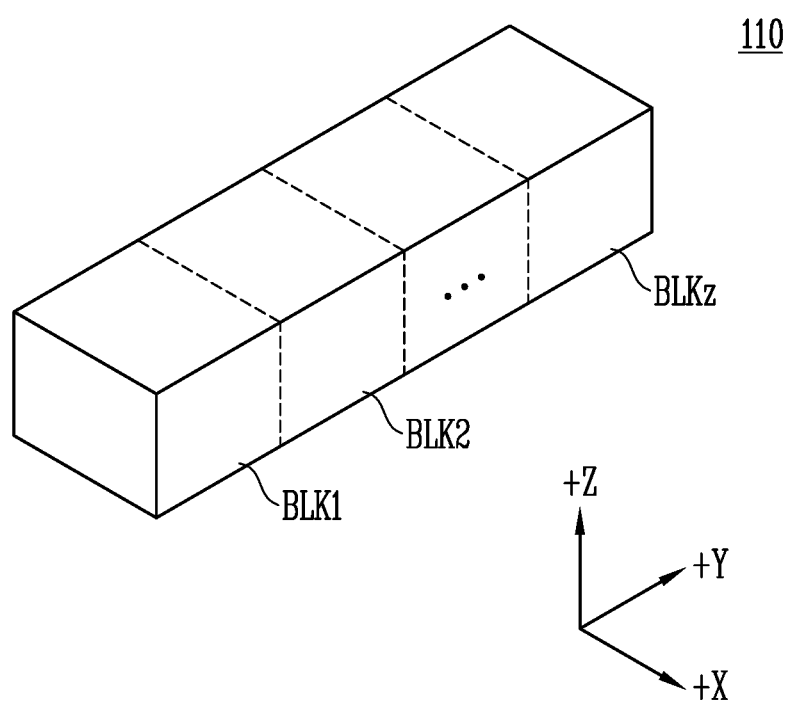
FIG. 4 is a diagram illustrating an embodiment of the memory cell array of FIG. 2.

FIG. 4 is a diagram illustrating an embodiment of the memory cell array of FIG. 2.

Referring to FIG. 4, the memory cell array 110 includes a plurality of memory blocks BLK1 to BLKz. Each memory block may have a three-dimensional (3D) structure. Each memory block includes a plurality of memory cells stacked on a substrate. Such memory cells are arranged in a positive X (+X) direction, a positive Y (+Y) direction, and a positive Z (+Z) direction. The structure of each memory block will be described in detail below with reference to FIGS. 5 and 6.

Figure 5:
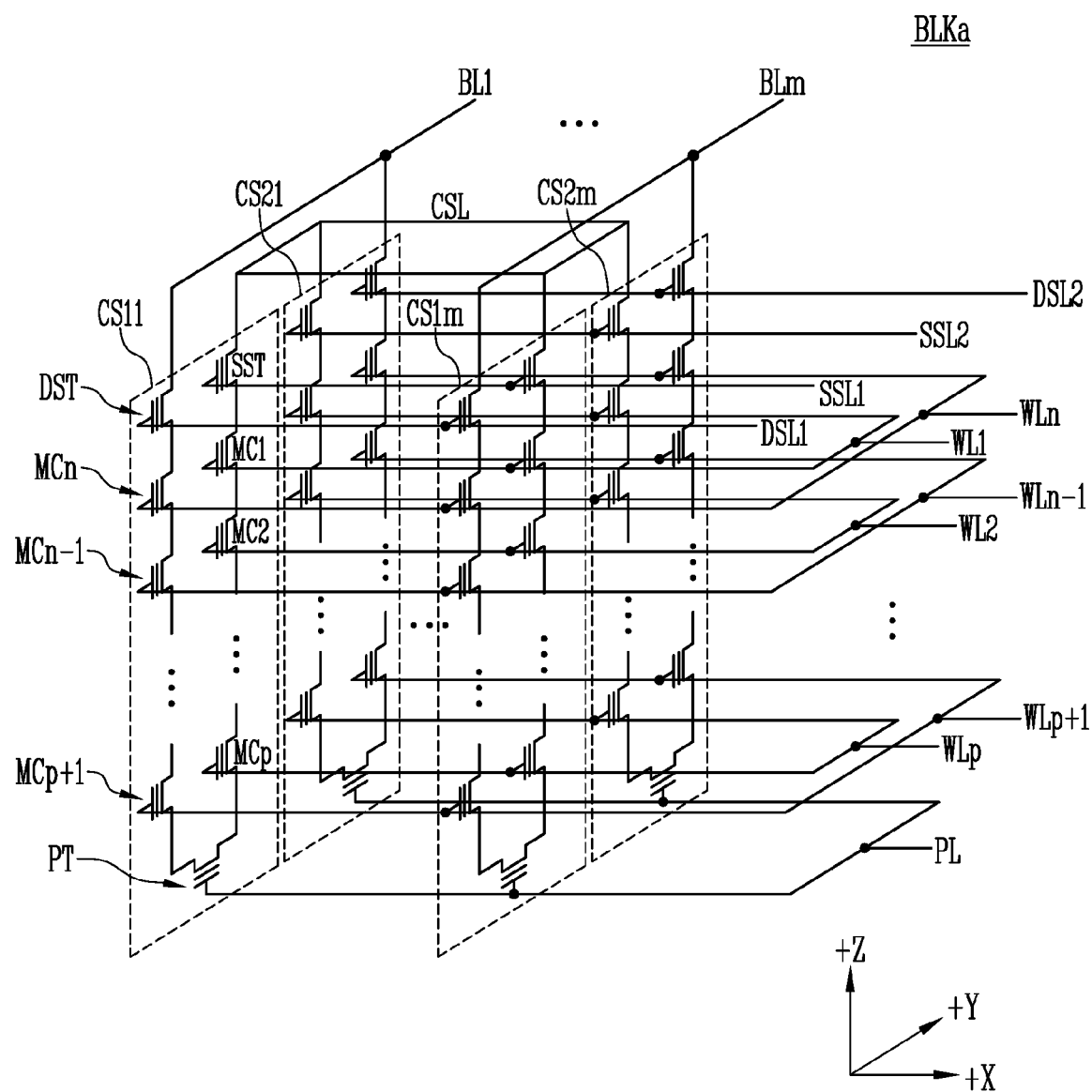
FIG. 5 is a circuit diagram illustrating one memory block BLKa of memory blocks BLK1 to BLKz of FIG. 4.

FIG. 5 is a circuit diagram illustrating one memory block BLKa of memory blocks BLK1 to BLKz of FIG. 4.

Referring to FIG. 5, the memory block BLKa includes a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings are arranged in a row direction (i.e. a positive (+) X direction). In FIG. 5, two cell strings are illustrated as being arranged in a column direction (i.e. a positive (+) Y direction). However, this illustration is made for convenience of description, and it will be understood that three or more cell strings may be arranged in the column direction.

In an embodiment, a single memory block may include a plurality of sub-blocks. A single sub-block may include cell strings arranged in a 'U' shape in a single column.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 5, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are coupled in series between the source select transistor SST and the pipe transistor PT. The p+1-th to n-th memory cells MCp+1 to MCn are sequentially arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is coupled between the corresponding bit line and the memory cells MCp+1 to MCn. The cell strings in a row direction are coupled to drain select lines extending in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extending in a column direction. In FIG. 5, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form an additional page. Cell strings arranged in the direction of a single row may be selected by selecting any of the drain select lines DSL1 and DSL2. A single page may be selected from the selected cell strings by selecting any of the word lines WL1 to WLn.

In an embodiment, instead of the first to m-th bit lines BL1 to BLm, even bit lines and odd bit lines may be provided. Further, even-numbered cell strings, among the cell strings CS11 to CS1m or CS21 to CS2m arranged in the row direction, may be coupled to respective even bit lines. Odd-numbered cell strings, among the cell strings CS11 to CS1m or CS21 to CS2m arranged in the row direction, may be coupled to respective odd bit lines.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer dummy memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells may be controlled by controlling the voltages that are applied to the dummy word lines coupled to respective dummy memory cells, and thus the dummy memory cells may have required threshold voltages.

Figure 6:
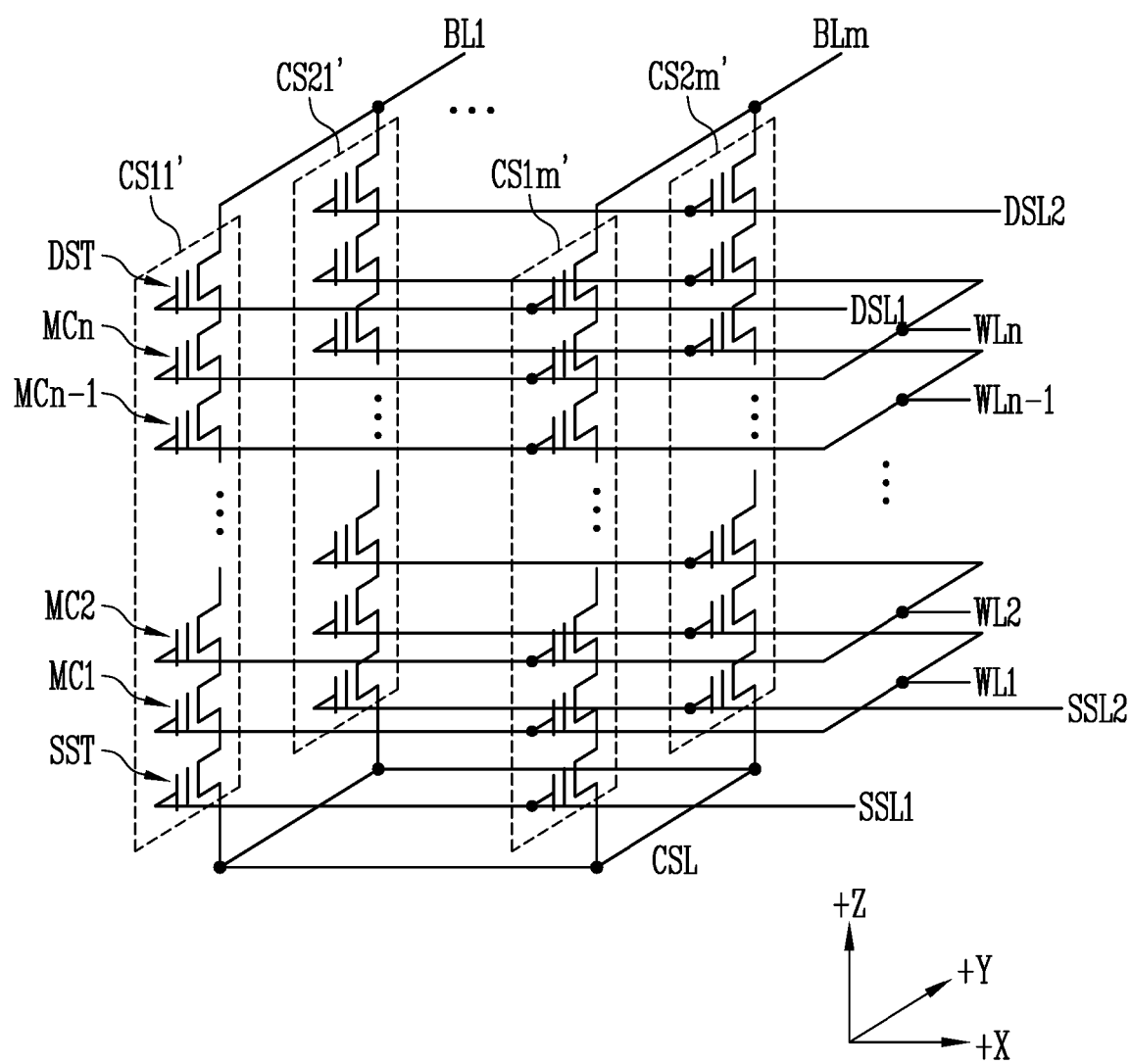
FIG. 6 is a circuit diagram illustrating an example of one memory block BLKb of the memory blocks BLK1 to BLKz of FIG. 4.

FIG. 6 is a circuit diagram illustrating an example of one memory block BLKb of the memory blocks BLK1 to BLKz of FIG. 4.

Referring to FIG. 6, the memory block BLKb may include a plurality of cell strings CS11' to CS1m' and CS21' to CS2m'. Each of the cell strings CS11' to CS1m' and CS21' to CS2m' extends in a positive (+) Z direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

In an embodiment, a single memory block may include a plurality of sub-blocks. A single sub-block may include cell strings arranged in an 'I' shape in a single column.

The source select transistor SST of each cell string is coupled between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. The gates of the first to n-th memory cells MC1 to MCn are coupled to first to n-th word lines WL1 to WLn, respectively.

The drain select transistor DST of each cell string is coupled between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 6 has an equivalent circuit similar to that of the memory block BLKa of FIG. 5 except that a pipe transistor PT is excluded from each cell string.

In an embodiment, instead of the first to m-th bit lines BL1 to BLm, even bit lines and odd bit lines may be provided. Further, even-numbered cell strings, among the cell strings CS11' to CS1m' or CS21' to CS2m' arranged in the row direction, may be coupled to respective even bit lines. Odd-numbered cell strings, among the cell strings CS11' to CS1m' or CS21' to CS2m' arranged in the row direction, may be coupled to respective odd bit lines.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As the number of dummy memory cells that are provided increases, the reliability of operation of the memory block BLKb may be improved, whereas the size of the memory block BLKb may increase. As the number of dummy memory cells that are provided decreases, the size of the memory block BLKb may decrease, whereas the reliability of operation of the memory block BLKb may be deteriorated.

In order to efficiently control the one or more dummy memory cells, respective dummy memory cells may have required threshold voltages. Before or after an erase operation on the memory block BLKb is performed, program operations may be performed on all or some of the dummy memory cells. When the erase operation is performed after the program operations have been performed, the dummy memory cells may have required threshold voltages by controlling voltages to be applied to dummy word lines coupled to respective dummy memory cells.

Figure 7:
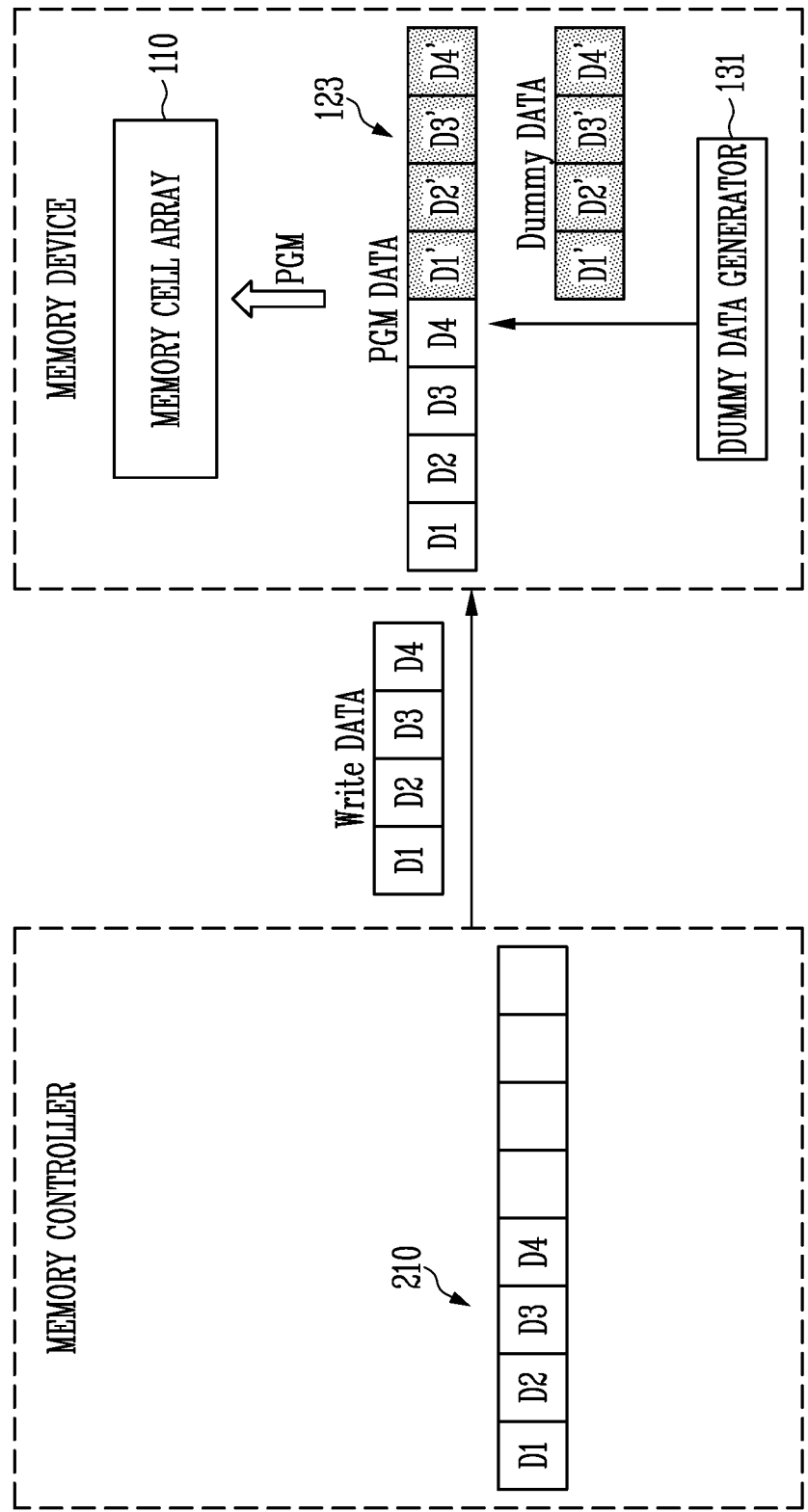
FIG. 7 is a diagram for describing a program operation according to an embodiment of the present disclosure.

FIG. 7 is a diagram for explaining a program operation according to an embodiment of the present disclosure.

Referring to FIG. 7, a write buffer 210 may store pieces of write data D1 to D4 to be programmed in a memory device. The size of the write data D1 to D4 stored in the write buffer 210 is not limited to the present embodiment.

The memory controller may provide the write data D1 to D4 to the memory device. The memory device may store the write data D1 to D4, received from the memory controller, in a main buffer included in the read and write circuit 123.

When the size of the write data D1 to D4 stored in the main buffer is less than the preset size, the dummy data generator 131 may generate pieces of dummy data D1' to D4' based on the write data D1 to D4 stored in the main buffer. In an embodiment, the preset size may be the size of data stored in one physical page. However, the preset size is not limited to the present embodiment.

Program data PGM DATA having the preset size, stored in the main buffer, may be programmed to the memory cell array 110. The program data PGM DATA may include the write data D1 to D4 and the dummy data D1' to D4'.

In other embodiments, the memory controller may generate dummy data when the size of the write data stored in the write buffer 210 is less than the preset size. The memory controller may store the generated dummy data in the write buffer 210. The memory controller may provide the write data and the dummy data, which are stored in the write buffer 210, to the memory device.

In the embodiment of FIG. 7, the memory device other than the memory controller generates the dummy data, and thus the write buffer 210 may be more efficiently used. The memory controller may directly flush the write data, stored in the write buffer 210, into the memory device without needing to generate dummy data. Therefore, the write buffer 210 may receive and store new write data after the previously stored write data has been flushed, without needing to wait for the memory controller to generate dummy data.

Figure 8:
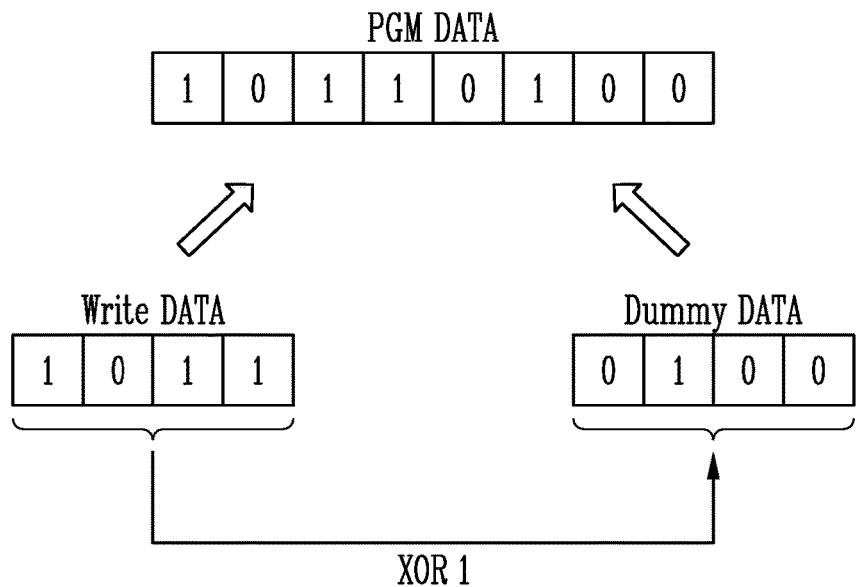
FIG. 8 is a diagram for describing the generation of dummy data according to an embodiment of the present disclosure.

FIG. 8 is a diagram for describing the generation of dummy data according to an embodiment of the present disclosure.

Referring to FIG. 8, when the size of write data is less than a preset size, dummy data may be generated.

In FIG. 8, the size of the write data '1011' may be 4 bits. The preset size may be 8 bits. The preset size is not limited to the present embodiment. Since the size of the write data '1011' is less than the preset size, dummy data may be generated. The dummy data may be data obtained by performing an exclusive OR (XOR) operation on the preset value and the write data. The preset value in FIG. 8 may be '1' which is one bit. However, the preset value may be any value including at least one bit without being limited to the present embodiment.

In FIG. 8, the dummy data may be calculated as '0100' by performing an XOR operation on the preset value '1' and the write data '1011'. The program data may be '10110100' including the write data '1011' and the dummy data '0100'. The positions of the write data and the dummy data may be changed. The size of the program data may be 8 bits corresponding to the preset size. The size of the dummy data may be determined to be a value obtained by subtracting the size of the write data from the preset size.

Figure 9:
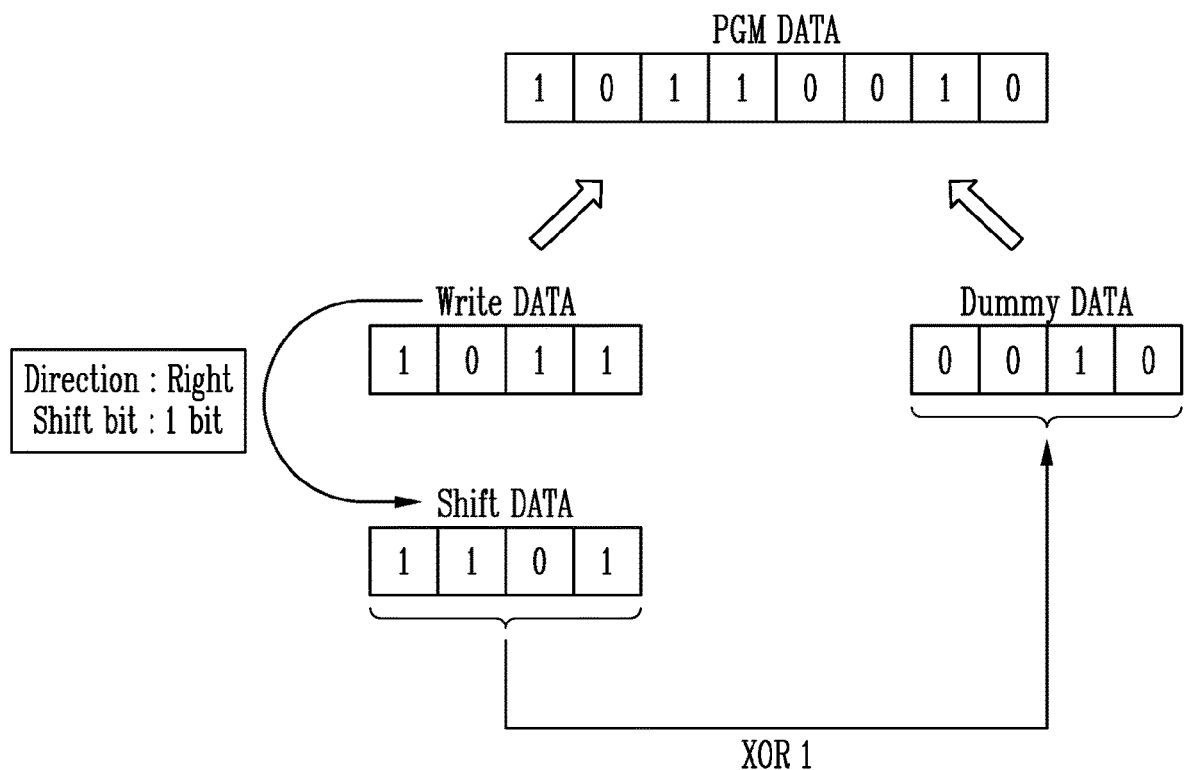
FIG. 9 is a diagram for describing the generation of dummy data according to an embodiment of the present disclosure.

FIG. 9 is a diagram for describing the generation of dummy data according to an embodiment of the present disclosure.

Referring to FIG. 9, unlike FIG. 8, dummy data may be data obtained by performing an XOR operation on shift data, other than write data, and a preset value. The shift data may be data obtained by shifting the write data by at least one bit in a preset direction.

When dummy data is generated, whether write data or shift data is to be used may be determined depending on the position of a word line to which memory cells for storing program data are coupled.

For example, when the program data is stored in memory cells coupled to an even word line, the dummy data may be calculated by performing an XOR operation on the write data and the preset value. When the program data is stored in memory cells coupled to an odd word line, the dummy data may be calculated by performing an XOR operation on the shift data and the preset value.

In other examples, when the program data is stored in memory cells coupled to an odd word line, the dummy data may be calculated by performing an XOR operation on the write data and the preset value. When the program data is stored in memory cells coupled to an even word line, the dummy data may be calculated by performing an XOR operation on the shift data and the preset value.

The reason for using write data or shift data depending on the position of the word line is to prevent program disturb occurring due to iterative generation of the same dummy data pattern when the same write data is stored in memory cells coupled to an adjacent word line. That is, the dummy data may be generated by selectively using write data or shift data depending on the position of a word line, and thus patterns of the dummy data may be variously generated.

In FIG. 9, the shift data may be calculated as '1101' because write data is '1011', a preset direction is a right direction, and a shifted bit is 1 bit. The preset direction and the number of shifted bits are not limited to the present embodiment.

The dummy data may be calculated as '0010' by performing an XOR operation on the preset value '1' and the shift data '1101'.

Therefore, the program data may include the write data '1011' and the dummy data '0010'.

Figure 10:
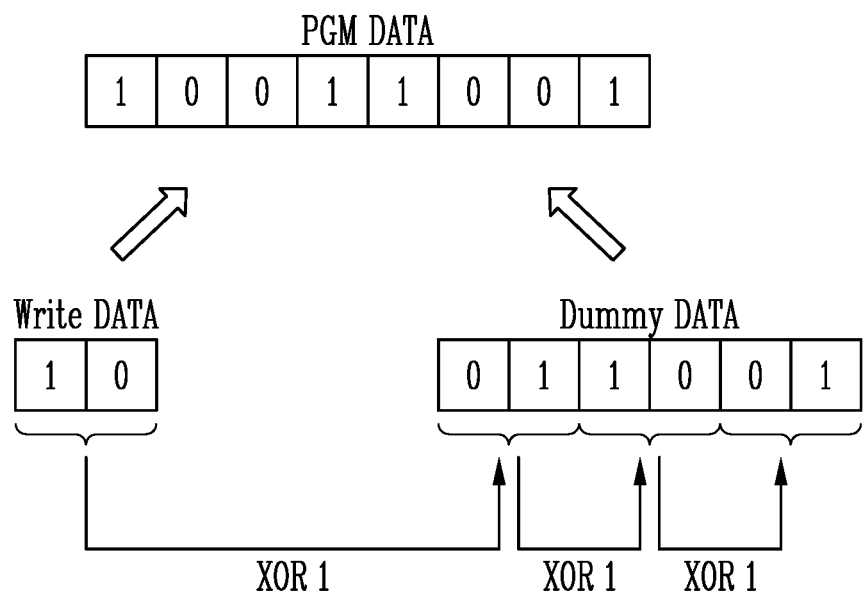
FIG. 10 is a diagram for describing the generation of dummy data according to an embodiment of the present disclosure.

FIG. 10 is a diagram for describing the generation of dummy data according to an embodiment of the present disclosure.

Referring to FIG. 10, write data may be '10', and the size thereof may be 2 bits. Since the size of the write data is less than a preset size, dummy data may be generated. Because the preset size is 8 bits, the size of the generated dummy data may be set to 6 bits.

In this case, the size of the write data is 2 bits, and thus first dummy data '01' may be generated by performing an XOR operation on the write data '10' and the preset value '1'. Second dummy data '10' may be generated by performing an XOR operation on the first dummy data '01' and the preset value '1'. Third dummy data '01' may be generated by performing an XOR operation on the second dummy data '10' and the preset value '1'. The dummy data may be generated as '011001' including the first to third dummy data.

The program data may be '10011001' including the write data '10' and the dummy data '011001'.

Figure 11:
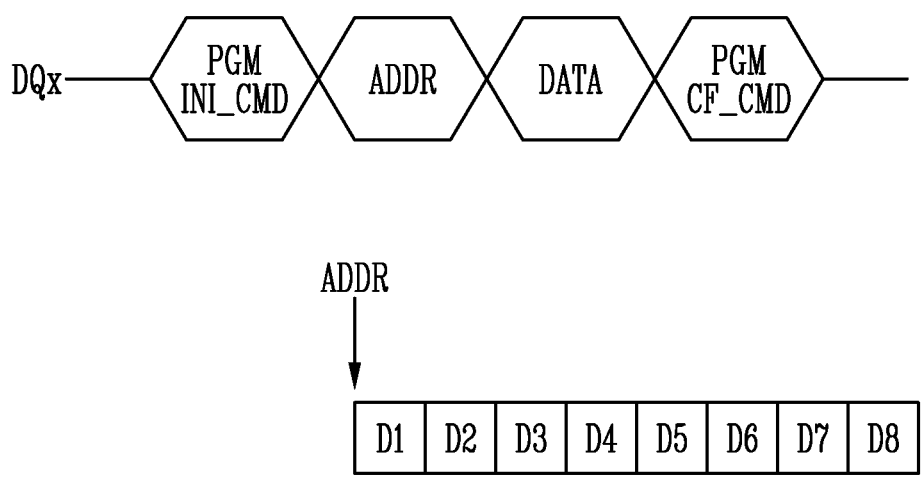
FIG. 11 is a diagram for describing a program command set according to an embodiment of the present disclosure.

FIG. 11 is a diagram for describing a program command set according to an embodiment of the present disclosure.

Referring to FIG. 11, the size of write data DATA provided by a memory controller to a memory device may correspond to a preset size. The memory controller may provide the memory device with a program initiation command PGM INI_CMD indicating the initiation of a program operation, a write address ADDR of an area in which the write data DATA is to be stored, and a program confirm command PGM CF_CMD indicating the completion of input for a program operation. The input for the program operation may include the input of the write data DATA, the write address ADDR, the program initiation command PGM INI_CMD, etc.

The memory device may receive the program initiation command PGM INI_CMD, the write address ADDR, the write data DATA, and the program confirm command PGM CF_CMD from the memory controller. After the program confirm command PGM CF_CMD has been received, the memory device may program the write data DATA to areas starting from the area indicated by the write address ADDR.

Figure 12:
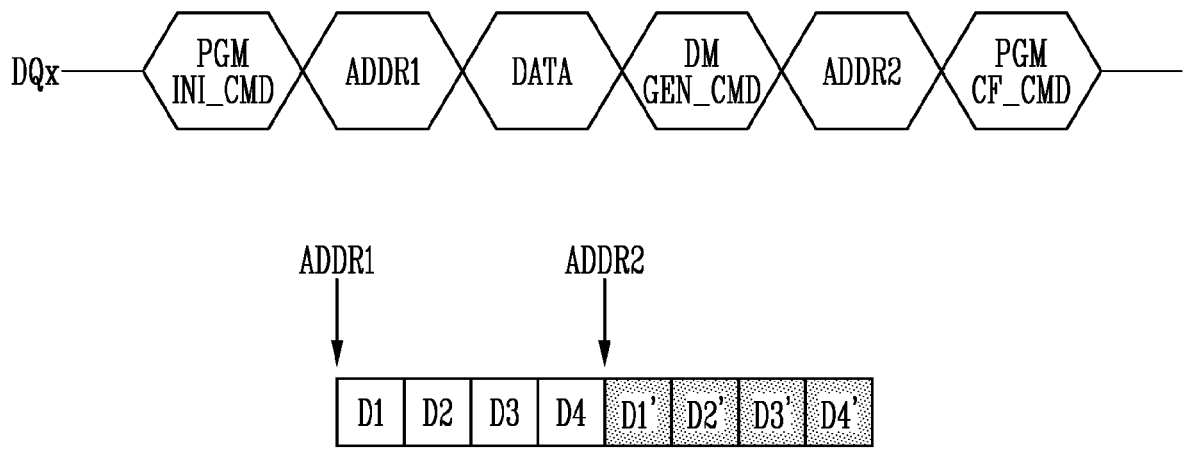
FIG. 12 is a diagram for describing a program command set according to an embodiment of the present disclosure.

FIG. 12 is a diagram for describing a program command set according to an embodiment of the present disclosure.

Referring to FIG. 12, the size of write data DATA provided by a memory controller to a memory device may be less than a preset size. The memory controller may provide the memory device with a program command set (DQx) that includes a dummy generation command DM GEN_CMD indicating the generation of dummy data based on the write data DATA. Program data may include the write data DATA and the dummy data, wherein the write data may be D1 to D4, and the dummy data may be D1' to D4'.

The memory controller may provide the memory device with the write data DATA, a write address indicating an area in which the program data is to be stored, and the program command set including the dummy generation command DM GEN_CMD.

The program command set may include a program initiation command PGM INI_CMD indicating the initiation of a program operation, the dummy generation command DM GEN_CMD, and a program confirm command PGM CF_CMD indicating the completion of input for a program operation.

The write address may include a first address ADDR1 and a second address ADDR2. When the program data is stored in a selected page, the first address ADDR1 may include a start address of an area in which D1 to D4 indicating the write data DATA are to be stored in the selected page. The second address ADDR2 may include a start address of an area in which D1' to D4' indicating the dummy data are to be stored in the selected page. The area in which the write data DATA is to be stored may be specified in the selected page through the first address ADDR1 and the second address ADDR2.

The memory device may receive the program initiation command PGM INI_CMD, the first address ADDR1, the write data DATA, the dummy generation command DM GEN_CMD, the second address ADDR2, and the program confirm command PGM CF_CMD from the memory controller. After the program confirm command PGM CF_CMD has been received, the memory device may generate dummy data having a size corresponding to a value obtained by subtracting the size of the write data DATA from the preset size in response to the dummy generation command DM GEN_CMD. The memory device may program the program data including the write data DATA and the generated dummy data to the selected page with reference to the first address ADDR1 and the second address ADDR2.

Figure 13:
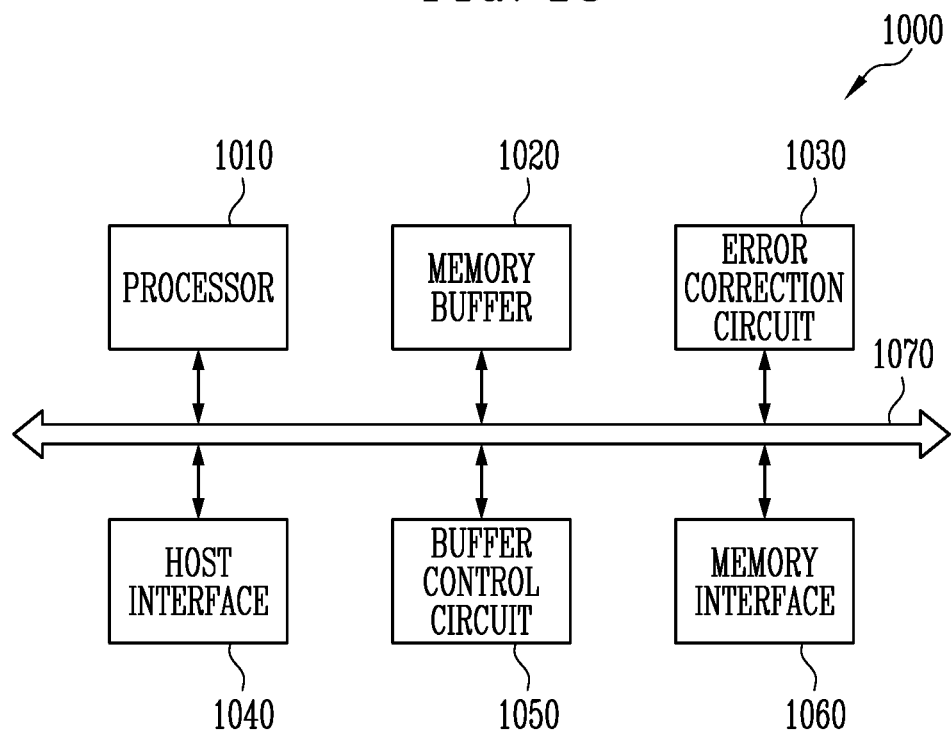
FIG. 13 is a diagram illustrating an embodiment of the present disclosure of a memory controller of FIG. 1.

FIG. 13 is a diagram illustrating an embodiment of the memory controller of FIG. 1.

Referring to FIG. 13, a memory controller 1000 is coupled to a host and a memory device. In response to a request from the host, the memory controller 1000 may access the memory device. For example, the memory controller 1000 may control read, write, erase, and background operations of the memory device. The memory controller 1000 may provide an interface between the memory device and the host. The memory controller 1000 may run firmware for controlling the memory device.

The memory controller 1000 may include a processor 1010, a memory buffer 1020, an error correction circuit (ECC) 1030, a host interface 1040, a buffer control circuit 1050, a memory interface 1060, and a bus 1070.

The bus 1070 may provide a channel between components of the memory controller 1000.

The processor 1010 may control the overall operation of the memory controller 1000 and perform a logical operation. The processor 1010 may communicate with an external host through the host interface 1040 and also communicate with the memory device through the memory interface 1060. Further, the processor 1010 may communicate with the memory buffer 1050 through the buffer control circuit 1020. The processor 1010 may control the operation of the storage device by using the memory buffer 1020 as a working memory, a cache memory or a buffer memory.

The processor 1010 may perform a function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processor 1010 may use a randomizing seed to randomize data received from the host Host. The randomized data may be provided, as data to be stored, to the memory device and may be programmed in the memory cell array.

The processor may derandomize the data received from the memory device during a read operation. For example, the processor 1010 may derandomize the data received from the memory device using a derandomizing seed. Derandomized data may be output to the host.

In an embodiment, the processor 1010 may run software or firmware to perform the randomizing or derandomizing operation.

The memory buffer 1020 may be used as a working memory, a cache memory, or a buffer memory of the processor 1010. The memory buffer 1020 may store codes and commands that are executed by the processor 1010. The memory buffer 1020 may store data that is processed by the processor 1010. The memory buffer 1020 may include a static RAM (SRAM) or a dynamic RAM (DRAM).

The error correction circuit 1030 may perform error correction. The error correction circuit 1030 may perform error correction code (ECC) encoding based on data to be written to the memory device through the memory interface 1060. The ECC-encoded data may be transferred to the memory device through the memory interface 1060. The error correction circuit 1030 may perform ECC decoding based on data received from the memory device through the memory interface 1060. In an example, the error correction circuit 1030 may be included, as the component of the memory interface 1060, in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Non-Volatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may transmit data in the memory controller 1000, and the control bus may transmit control information, such as commands or addresses, in the memory controller 1000. The data bus and the control bus may be separated from each other, and may neither interfere with each other nor influence each other. The data bus may be coupled to the host interface 1040, the buffer control circuit 1050, the error correction circuit 1030, and the memory interface 1060. The control bus may be coupled to the host interface 1040, the processor 1010, the buffer control circuit 1050, the memory buffer 1020, and the memory interface 1060.

In an embodiment, the write buffer 210 of FIG. 1 may be included in the memory buffer 1020. The write controller 220 of FIG. 1 may be included in the processor 1010.

Figure 14:
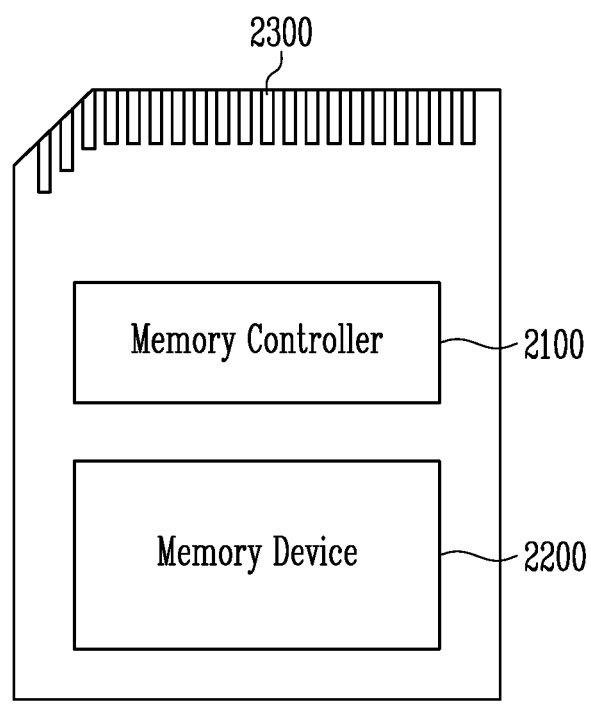
FIG. 14 is a block diagram illustrating a memory card system to which a storage device according to an embodiment of the present disclosure is applied.

FIG. 14 is a block diagram illustrating a memory card system to which a storage device according to an embodiment of the present disclosure is applied.

Referring to FIG. 14, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same manner as the memory controller 200, described above with reference to FIG. 1.

In an embodiment, the memory controller 2100 may include components, such as a RAM, a processor, a host interface, a memory interface, and an error correction circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various interface protocols such as universal serial bus (USB), multimedia card (MMC), embedded MMC (eMMC), peripheral component interconnection (PCI), PCI-express (PCI-E), an advanced technology attachment (ATA) protocol, a serial-ATA (SATA), parallel-ATA (PATA), small computer system interface (SCSI), enhanced small disk interface (ESDI), integrated drive electronics (IDE), firewire, universal flash storage (UFS), WIFI, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into a single semiconductor device to form a memory card. For example, the memory controller 2100 and the memory device 2200 may be integrated into a single semiconductor device and may then form a memory card such as a personal computer memory card international association (PCMCIA), a compact flash card (CF), a smart media card (SM or SMC), a memory stick, a multimedia card (MMC, RS-MMC, MMCmicro or eMMC), a SD card (SD, miniSD, microSD, or SDHC), a universal flash storage (UFS), or the like.

Figure 15:
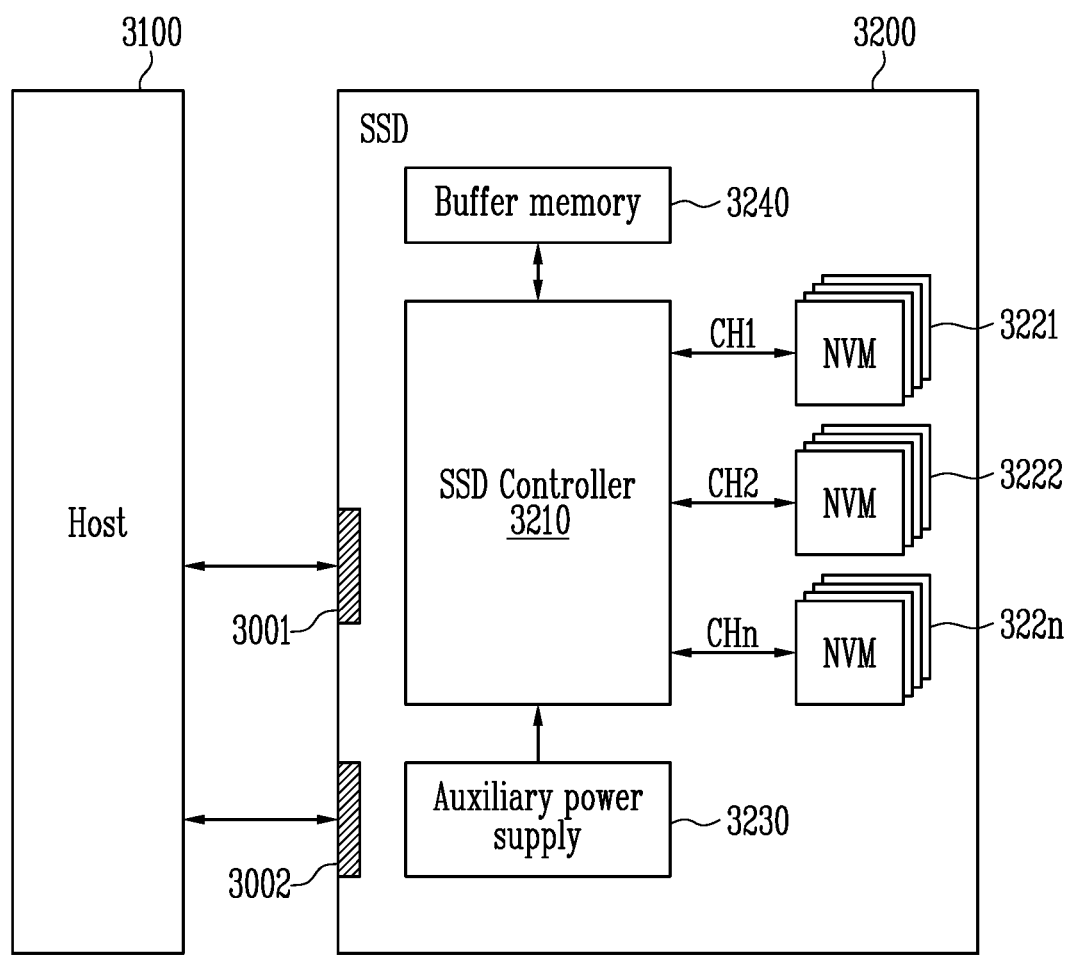
FIG. 15 is a block diagram illustrating a solid state drive (SSD) system to which a storage device according to an embodiment of the present disclosure is applied.

FIG. 15 is a block diagram illustrating a solid state drive (SSD) system to which a storage device according to an embodiment of the present disclosure is applied.

Referring to FIG. 15, an SSD system 3000 may include a host 3100 and an SSD 3200. The SSD 3200 may exchange a signal SIG with the host 3100 through a signal connector 3001, and may receive power PWR through a power connector 3002. The SSD 3200 may include an SSD controller 3210, a plurality of flash memories 3221 to 322n, an auxiliary power supply 3230, and a buffer memory 3240.

In accordance with an embodiment of the present disclosure, the SSD controller 3210 may perform the function of the memory controller 200, described above with reference to FIG. 1.

The SSD controller 3210 may control the plurality of flash memories 3221 to 322n in response to the signal SIG received from the host 3100. In an embodiment, the signal SIG may indicate signals based on the interfaces of the host 3100 and the SSD 3200. For example, the signal SIG may be a signal defined by at least one of various interfaces such as universal serial bus (USB), multimedia card (MMC), embedded MMC (eMMC), peripheral component interconnection (PCI), PCI-express (PCI-E), an advanced technology attachment (ATA), serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be located inside the SSD 3200 or located outside the SSD 3200. For example, the auxiliary power supply 3230 may be located in a main board, and may also provide auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n, or may temporarily store metadata (e.g., mapping tables) of the flash memories 3221 to 322n. The buffer memory 3240 may include volatile memories, such as DRAM, SDRAM, DDR SDRAM, LPDDR SDRAM, and GRAM, or nonvolatile memories, such as FRAM, ReRAM, STT-MRAM, and PRAM.

Figure 16:
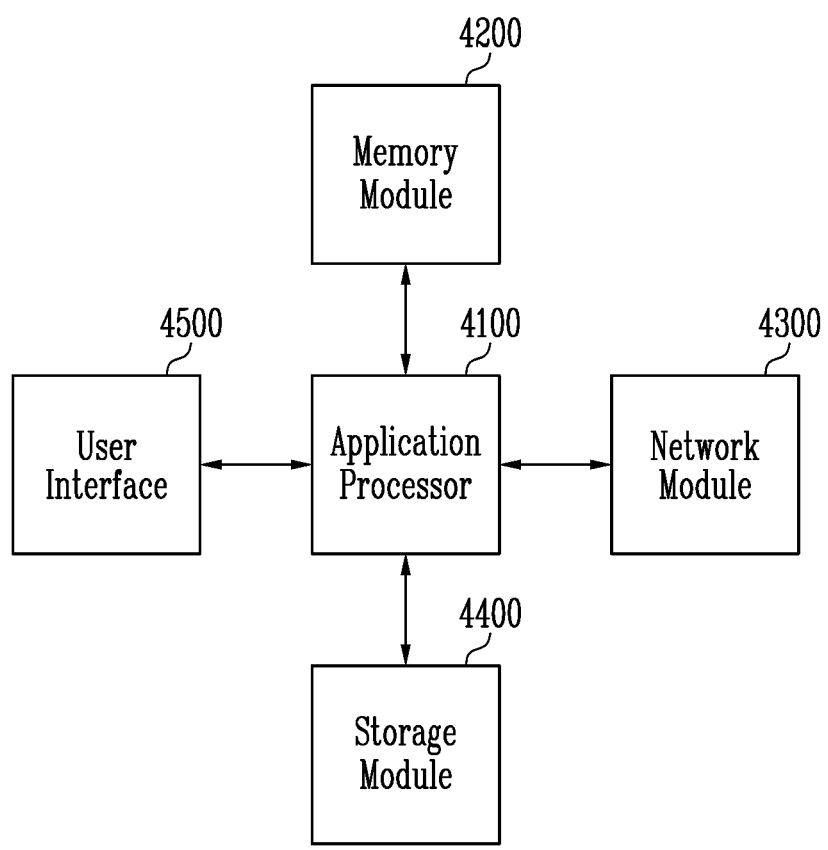
FIG. 16 is a block diagram illustrating a user system to which a storage device according to an embodiment of the present disclosure is applied.

FIG. 16 is a block diagram illustrating a user system to which a storage device according to an embodiment of the present disclosure is applied.

Referring to FIG. 16, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be formed of a system-on-chip (SoC).

The memory module 4200 may act as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, LPDDR2 SDRAM, and LPDDR3 SDRAM or nonvolatile RAMs such as PRAM, ReRAM, MRAM, and FRAM. In an embodiment, the application processor 4100 and the memory module 4200 may be packaged based on a package-on-package (POP), and may then be provided as a single semiconductor package.

The network module 4300 may communicate with external devices. In an embodiment, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WI-FI. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (removable drive), such as a memory card or an external drive of the user system 4000.

In an embodiment, the storage module 4400 may include a plurality of nonvolatile memory devices, each of which may be operated in the same manner as the memory device 100, described above with reference to FIG. 1. The storage module 4400 may be operated in the same manner as the storage device 50, described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there are provided a storage device having improved program performance and a method of operating the storage device.

The above-described embodiments of the present disclosure are intended to illustrate and not to limit the present invention. Various alternatives and equivalents are possible. The invention is not limited by the embodiments described herein. Nor is the invention limited to any specific type of storage device. Other additions, subtractions, or modifications which are apparent in view of the present disclosure, are intended to fall within the scope of the appended claims.

What is claimed is:

1. A memory device of a storage device, comprising: a plurality of memory cells; a peripheral circuit configured to perform a program operation on memory cells selected from among the plurality of memory cells; and a control logic configured to receive write data from a memory controller of the storage device that is external to the memory device, to generate dummy data corresponding to the write data when a size of the write data to be programmed to the selected memory cells is less than a preset size, and to control the peripheral circuit to store program data including the write data and the dummy data in the selected memory cells, wherein the control logic comprises: a dummy data generator configured to generate the dummy data based on the write data; and a program operation controller configured to control the dummy data generator to generate the dummy data when the size of the write data is less than the preset size, and wherein the dummy data generator generates the dummy data based on all or part of the write data.

2. The memory device according to claim 1, wherein the dummy data generator generates the dummy data by performing an exclusive OR (XOR) operation on a preset value and the write data.

3. The memory device according to claim 1, wherein the dummy data generator generates the dummy data by performing an XOR operation on a preset value and shift data, obtained by shifting the write data, depending on a position of a selected word line coupled to the selected memory cells.

4. The memory device according to claim 3, wherein the dummy data generator generates the shift data by shifting the write data by at least one bit in a preset direction.

5. The memory device according to claim 1, wherein the program data has the preset size which is a size of data stored in one physical page.

6. A memory controller for controlling a memory device, comprising: a write buffer configured to store write data to be programmed to the memory device; and a write controller configured to provide the memory device with the write data and a program command set that includes a dummy generation command indicating generation of the dummy data based on the write data when a size of the write data is less than a preset size, and to store program data including the write data and the dummy data, wherein the memory device generates the dummy data based on all or part of the write data in response to the dummy generation command.

7. The memory controller according to claim 6, wherein the program command set includes a program initiation command indicating initiation of a program operation, the dummy generation command, and a program confirm command indicating completion of input for the program operation.

8. The memory controller according to claim 7, wherein the write controller sequentially provides the memory device with the program initiation command, a first address, the write data, the dummy generation command, a second address, and the program confirm command.

9. The memory controller according to claim 8, wherein:
the program data is stored in a page selected from among a plurality of pages included in the memory device,
the first address includes a start address of an area in which the write data is to be stored in the selected page, and
the second address includes a start address of an area in which the dummy data is to be stored in the selected page.

10. The memory controller according to claim 6, wherein the program data has the preset size which is a size of data stored in one physical page.

11. A storage device, comprising: a memory device including a plurality of memory cells; and a memory controller, which is external to the memory device, configured to provide the memory device with write data, control the memory device to generate dummy data based on the write data, when a size of the write data is less than a preset size, and to store program data including the write data and the dummy data in selected memory cells among the plurality of memory cells, wherein: the memory controller provides the memory device with a write address indicating an area in which the write data is to be stored and a program command set including a dummy generation command indicating generation of the dummy data, and the memory device generates the dummy data based on the write data in response to the dummy generation command.

12. The storage device according to claim 11, wherein: the program command set includes a program initiation command indicating initiation of a program operation, the dummy generation command, and a program confirm command indicating completion of input for the program operation, the program data is stored in a selected page corresponding to the selected memory cells, and the write address includes start addresses of respective areas in which the write data and the dummy data are to be stored, in the selected page.

13. The storage device according to claim 11, wherein the memory device generates the dummy data by performing an exclusive OR (XOR) operation on a preset value and the write data.

14. The storage device according to claim 11, wherein the memory device generates the dummy data by performing an XOR operation on a preset value and shift data, obtained by shifting the write data, depending on a position of a selected word line coupled to the selected memory cells.

15. The storage device according to claim 14, wherein the memory device generates the shift data by shifting the write data by at least one bit in a preset direction.

16. The storage device according to claim 11, wherein the program data has the preset size which is a size of data stored in one physical page.

* * * * *